(12) United States Patent
Minamio et al.

(10) Patent No.: US 7,789,575 B2
(45) Date of Patent: Sep. 7, 2010

(54) OPTICAL DEVICE, OPTICAL DEVICE APPARATUS, CAMERA MODULE, AND OPTICAL DEVICE MANUFACTURING METHOD

(75) Inventors: Masanori Minamio, Osaka (JP); Yutaka Harada, Kyoto (JP); Toshiyuki Fukuda, Kyoto (JP)

(73) Assignee: Panasonic Corporation, Osaka (JP)

( * ) Notice: Subject to any disclaimer, the term of this patent is extended or adjusted under 35 U.S.C. 154(b) by 1042 days.

(21) Appl. No.: 11/490,232

(22) Filed: Jul. 21, 2006

(65) Prior Publication Data
US 2007/0019101 A1 Jan. 25, 2007

(30) Foreign Application Priority Data
Jul. 21, 2005 (JP) .............................. 2005-211572
Apr. 26, 2006 (JP) .............................. 2006-121755

(51) Int. Cl.
*G03B 17/00* (2006.01)
*H01L 21/00* (2006.01)
(52) U.S. Cl. ...................... 396/439; 438/116; 257/434
(58) Field of Classification Search ................ 396/439; 257/434; 438/116
See application file for complete search history.

(56) References Cited
U.S. PATENT DOCUMENTS

| | | | | |
|---|---|---|---|---|
| 6,266,197 B1* | 7/2001 | Glenn et al. | ................ | 359/819 |
| 6,407,381 B1* | 6/2002 | Glenn et al. | ................ | 250/239 |
| 6,618,196 B2* | 9/2003 | Ikari et al. | ................ | 359/457 |
| 2004/0077121 A1* | 4/2004 | Maeda et al. | ................ | 438/75 |
| 2004/0159920 A1* | 8/2004 | Omori | ................ | 257/676 |
| 2004/0161871 A1* | 8/2004 | Omori | ................ | 438/68 |
| 2005/0275079 A1* | 12/2005 | Stark | ................ | 257/680 |
| 2005/0275741 A1* | 12/2005 | Watanabe et al. | ................ | 348/340 |
| 2006/0108518 A1* | 5/2006 | Lee et al. | ................ | 250/239 |
| 2007/0018309 A1* | 1/2007 | Chang et al. | ................ | 257/704 |

FOREIGN PATENT DOCUMENTS

| | | |
|---|---|---|
| JP | 3-151666 A | 6/1991 |
| JP | 2003-31782 A | 1/2003 |

* cited by examiner

*Primary Examiner*—W.B. Perkey
*Assistant Examiner*—Noam Reisner
(74) *Attorney, Agent, or Firm*—McDermott Will & Emery LLP

(57) ABSTRACT

An optical device includes an optical element, a transparent member arranged on the optical element, and a transparent resin adhesive for causing the transparent member to adhere and be fixed onto a circuit formation face of the optical element. The optical device includes a light detecting region having a plurality of micro lenses, a peripheral circuit region formed in the outer peripheral part of the light detecting region, and an electrode region formed at the outer peripheral part of the peripheral circuit region. A roughed region in a saw-toothed shape in section is formed in part of a face of the transparent member which adheres to the optical element, the part being overlapped with the outer peripheral part of the light detecting region as viewed in plan.

1 Claim, 11 Drawing Sheets

OPTICAL DEVICE, OPTICAL DEVICE APPARATUS, CAMERA MODULE, AND OPTICAL DEVICE MANUFACTURING METHOD

BACKGROUND OF THE INVENTION

1. Field of the Invention

The present invention relates to an optical device and a method for manufacturing it.

2. Prior Art

In association with recent progress of miniaturization, thinning, lighting, and multi-functionalization of electronic appliances, the mainstream of semiconductor device implementation technology has been being transferred from conventional package type implementation to flip chip implementation which is implementation in a unit of a bear chip or a CSP to a circuit board or the like. Such implementation is under examination in semiconductor imaging devices.

For example, the following technique was proposed as a structure and a manufacturing method thereof for attaining a lightweight semiconductor imaging device at low cost.

First, a cap glass is attached to a substrate so as to cover an imaging element section of each chip in the form of a wafer. Wherein, an attached part of the cap glass is set so as not to overlap with an imaging region on the substrate. Then, the semiconductor imaging element array in which semiconductor imaging elements are formed is diced and separated into individual pieces. The resultant semiconductor imaging element is die-bonded using an adhesive to adhere and be fixed at the bottom of a packaging box. Then, an electrode terminal of the semiconductor imaging element is connected to a terminal of a package by means of a metal wire in a wire bonding process. Thus, the semiconductor imaging device is manufactured (see Japanese Patent Application Laid Open Publication No. 03-151666A, for example).

In the above conventional example, the cap glass covers the imaging region of the semiconductor imaging element at the initial stage of the assembly, preventing the imaging region from damage of a flaw and the like and preventing deficiency which would be caused due to dust adhesion or the like in the assembly process thereafter. Further, in the above conventional example, the cap glass is attached to only a semiconductor imaging element accepted in a test carried out at the stage of the semiconductor imaging element array. This reduces assembly cost.

Another structure of a semiconductor imaging device of thin type was proposed which can be manufactured at low cost. This structure is composed of a semiconductor imaging element including an imaging region formed on a semiconductor substrate, a plurality of micro lenses, a plurality of electrode terminals, and a peripheral circuit region and a transparent plate on the semiconductor imaging element which adheres to the micro lenses by means of an adhesive having a low refractive index (see Japanese Patent Application Laid Open Publication No. 2003-031782A, for example)

SUMMARY OF THE INVENTION

In the first conventional example, the respective cap glasses separated in advance are aligned one by one and then are made to adhere to the respective semiconductor imaging elements as accepted chips of the semiconductor imaging element array. Reflected light from an electrode terminal provided in the peripheral part, a wire lead connected thereto, or the like enters into the imaging regions to cause a smear or a flare. Though the cap glasses can be manufactured easily, such a phenomenon cannot be prevented in the first conventional example.

Referring to the second conventional example, the electrode terminals of the semiconductor imaging element can be formed only at opposite two sides out of the four sides. This imposes a severe limitation on the number of the electrode terminals that can be formed. Also, in this example, the phenomenon cannot be prevented in which reflected light from an electrode terminal provided in the peripheral part, a wire lead connected thereto, or the like enters into the imaging region to cause a smear or a flare.

The present invention has been made for solving the above problems and has its object of providing an optical device such as a semiconductor imaging device which is compact, is thin, is easily manufactured, and suppresses optical noise and providing a manufacturing method thereof.

In order to solve the above problem, an optical device of the present invention includes: an optical element one of faces of which serves as a circuit formation face where a circuit is to be formed and which includes in the circuit formation face a region for light detection or emission and an electrode region in which an electrode terminal for connecting with an external circuit is formed; and a transparent member which is arranged on at least the region for light detection or emission and which is larger in plan than at least the region for light detection or emission; a transparent adhesive for causing the transparent member to adhere and be fixed to the optical element, wherein a roughed region is formed in a region of a face of the transparent member which adheres to the optical element, the region being overlapped in plan with a region surrounding the region for light detection or emission.

In this structure, the roughed region is formed in the transparent member so that light entering in this region is scattered, preventing reflected light from an electrode terminal or a wire lead thereof to enter into the region where light is to be detected or emitted. This suppresses a smear and a flare in the case where the optical device of the present invention includes a light receiving element, resulting in provision of high quality images. Further, in this optical device, the transparent member such as a glass adheres to the optical element directly, facilitating correction of the optical axis of emitting light, compared with the case with the transparent member set apart from the optical element, and enabling prevention of lowering of emitted light output.

Further, in the optical device of the present invention, the transparent member is arranged on the bare chip, which means thinned and compacted optical device compared with one that is resin-sealed in a molding process.

The roughed region is preferably formed in a region not overlapped with the region for light detection or emission as viewed in plan.

The transparent member is made of any one material of, for example, optical glass, quartz, crystal, and optical transparent resin.

Moreover, when an antireflection film is formed at least one of the inner face of the roughed region and the outer peripheral face of the transparent member, entering of reflected light from an electrode terminal, a wire lead thereof, or the like into the region for light detection or emission is suppressed further.

An optical device manufacturing method of the present invention includes: a step (a) of forming an optical element array including a plurality of optical elements each including a region for light detection or emission and an electrode region in which an electrode terminal for connecting with an external circuit is formed; a step (b) of forming on the optical elements transparent members in which roughed regions are formed and each of which has a dimension in plan larger than the region for light detection or emission; and a step (c) of forming optical devices each including the optical element and the transparent member by dicing the optical element array, wherein in the step (b), each of the transparent members are formed so that the roughed region faces a region surrounding the region for light detection or emission.

This method enables manufacture of an optical device in which the aforementioned smear and flare are suppressed. Wherein, the step (b) of forming the transparent members includes various methods. One example is that: a transparent member array including a plurality of parts to be the transparent members is formed, is joined to the optical element array, and then, is separated to the individual transparent members. Alternatively, after individual transparent members are formed in advance, the transparent members are sequentially made to adhere onto the optical elements. Further, the transparent member array can be formed by etching or by molding using a molding die.

As described above, in the optical device of the present invention, the transparent member is directly mounted on the principal face of the optical element, achieving reduction in thickness and size. Reflected light from an electrode terminal provided in the outer peripheral part of the region for light detection or emission or a wire lead thereof enters to the region for light detection or emission to serve as stray light. In the optical device of the present invention, however, this phenomenon can be suppressed. As a result, an optical device inviting neither a smear nor a flare and excellent in optical characteristic can be realized by the simple manufacturing method.

DESCRIPTION OF THE PREFERRED EMBODIMENTS

Figure 1A:
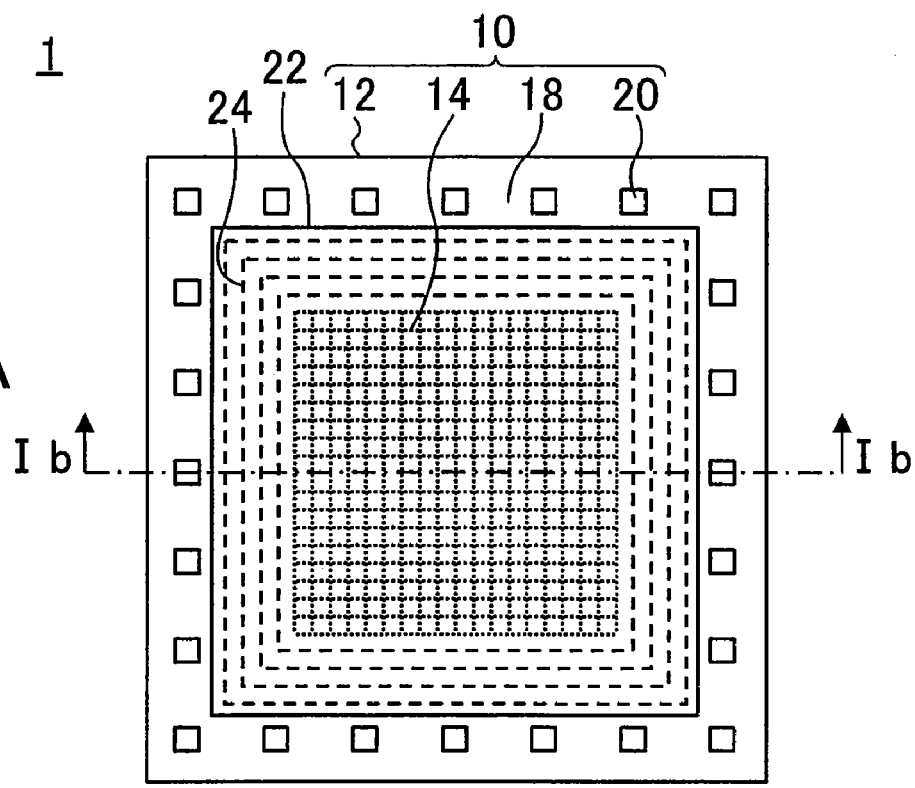
FIG. 1A is a plan view showing an optical device according to Embodiment 1 of the present invention.

Embodiments of the present invention will be described below in detail with reference the accompanying drawings. Wherein, thickness, length, and the like of elements in the drawings are different from actual ones for the sake of easy drafting of the drawings. Also, the number of electrode terminals on an optical element is set to the number to be drawn easily. The same reference numerals are assigned to the same elements for omitting, in some cases, the description thereof.

Embodiment 1

Figure 1B:
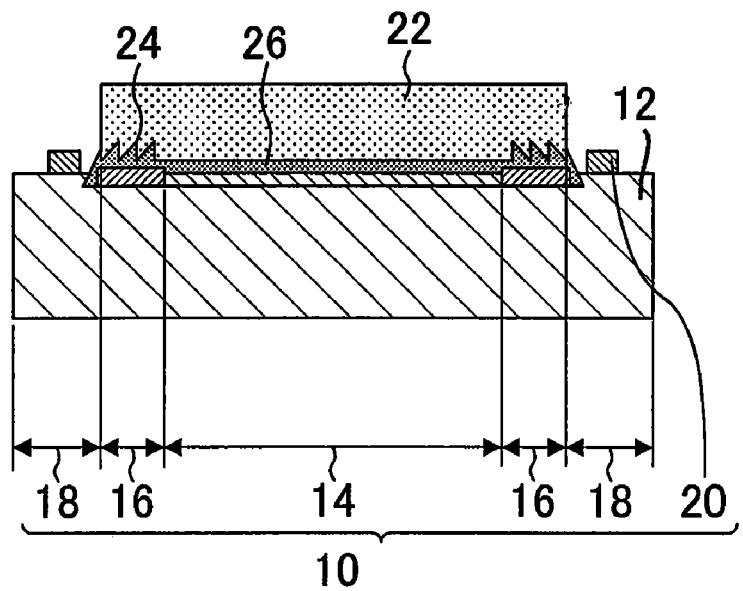
FIG. 1B is a section taking along the line Ib-Ib in FIG. 1A.

FIG. 1A is a plan view showing an optical device 1 according to Embodiment 1 of the present invention, and FIG. 1B is a section taking along the line Ib-Ib in FIG. 1A.

As shown in FIG. 1A and FIG. 1B, the optical device 1 of the present embodiment includes an optical element 10 including, in a semiconductor substrate 12, a light detecting region 14, a peripheral circuit region 16, and electrode region 18 including a plurality of electrode terminals 20, a transparent member 22, and a transparent resin adhesive 26 for making the transparent member 22 to adhere and be fixed to the optical element 10. At least one of a light receiving element and a light emitting element is provided as the optical element 10 in the optical device 1. The light receiving element is an image sensor such as a CMOS sensor, a CCD sensor, or the like while the light emitting element is, for example, a laser, a light emitting diode, or the like. In the case where the optical element 10 serves as the light receiving element, the light detecting region 14 serves as an imaging region.

The light detecting region 14 is formed at the central part of the semiconductor substrate 12 and includes a plurality of electro-optic conversion elements (not shown) arranged in matrix and further includes a color filter and a micro lens which are provided on each of the electro-optic conversion elements.

The peripheral circuit region 16 is formed so as to surround the light detecting region 14 in the semiconductor substrate 12 and includes a circuit for processing electric signals output from the electro-optic conversion elements.

In the outermost peripheral region of the semiconductor substrate 12, the electrode region 18 including the plurality of electrode terminals 20 is formed. The electrode terminals 20 are used for connecting with an external appliance. It is noted that a silicon substrate made of single crystal of silicon is employed in general as the semiconductor substrate 12 but another semiconductor material may be employed.

The transparent member 22 is in a flat shape larger than at least the light detecting region 14, and a roughed region 24 having a saw-toothed shape in section is formed in a region adhering to the outer peripheral part (peripheral circuit region 16 and the like) of the light detecting region 14 in the face of the transparent member 22 adhering to the optical element 10. The roughed region 24 is in a form of a rectangle like one formed of four strips as view in plan. In detail, the transparent member 22 adheres and is fixed onto the face of the optical element 10 by means of the transparent resin adhesive 26 so that the roughed region 24 surrounds the light detecting region 14. The thickness of the transparent member 22 is set within the range, for example, between 200 μm and 500 μm, both inclusive, and preferably set to approximately 350 μm. The roughed region 24 is in a shape of bumps and dips or is serrated (saw-toothed shape), or the like.

The upper face and the lower face of at least part of the transparent member 22 which is located on the light detecting region 14 are flat, are in parallel to each other, and forms an optical plane. In the roughed region 24, plural peaks and plural valleys are formed coaxially so as to form rectangles surrounding the light detecting region 14. The difference between the peaks and valleys is set to 200 μm or smaller, for example.

As a material of the transparent member 22, optical glass, quartz, crystal, optical transparent resin, or the like is employed, for example. As the optical transparent resin, any resin material generally used in optics can be employed, such as epoxy-based resin, acryl-based resin, methacrylate-based resin, polycarbonate-based resin, polyolefin-based resin, polyester-based resin, fluorine-containing polymer, fluoridated polyimide, or the like.

The transparent resin adhesive 26 is used especially for adhesion and fixing of the transparent member 22 to the light detecting region 14 of the optical element 10 and must be made of an optically transparent material. The transparent resin adhesive 26 is required to have a refractive index different from the micro lenses formed in the light detecting region 14. Particularly, it is desirable that the transparent adhesive 26 has a refractive index lower than the micro lenses because a light collecting effect would be expected. Wherein, if the optical element 10 includes a light emitting element, the light detecting region 14 serves as a light emitting region.

At light irradiation from outside, reflected light from the outer peripheral part of the light detecting region 14, especially, from an electrode terminal 20, a wire lead (not shown) for connecting it, or the like enters into the light detecting region 14 to serve as stray light, causing optical noise. However, with the above structure, such optical noise can be suppressed effectively.

A method for manufacturing the optical device of the present embodiment will be described next. First, a process of forming a transparent member array 36 will be described. FIG. 2A to FIG. 2D are sections showing the process of forming the transparent member array 36 in the optical device manufacturing method according to the present embodiment. Wherein, an optical glass is used as a transparent plate in the present embodiment.

Figure 2A:
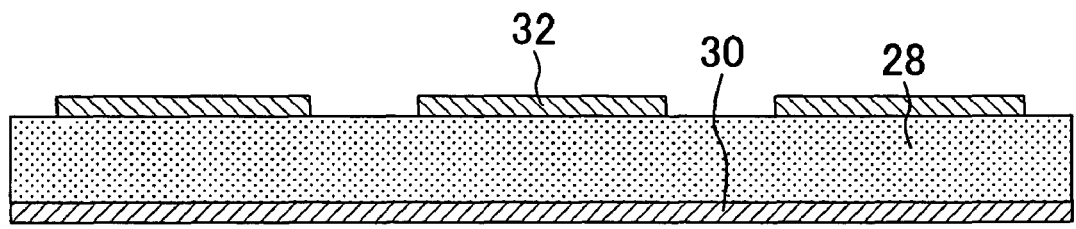
FIG. 2A to FIG. 2D are sections showing a process of forming a transparent member array in an optical device manufacturing method according to Embodiment 1.

First, as shown in FIG. 2A, a transparent plate 28 having substantially the same shape as the optical element array is prepared. Then, a photoresist pattern 32 for forming defining grooves 34, which will be described later, is formed on one of the faces of the transparent plate 28 while a surface protection film 30 is formed on the entirety of the other face thereof. Any material may be employed as a material of the surface protection film 30 with no limitation only if it is durable against a chemical solution used in etching the optical glass as will be described later. The photoresist pattern 32 is formed by applying a photoresist film onto the entirety of the face of the transparent plate 28 and subjecting the photoresist film to exposure and development so that a region of the transparent plate 28 which corresponds to the electrode region 18 of the optical element 10 is exposed.

Figure 2B:
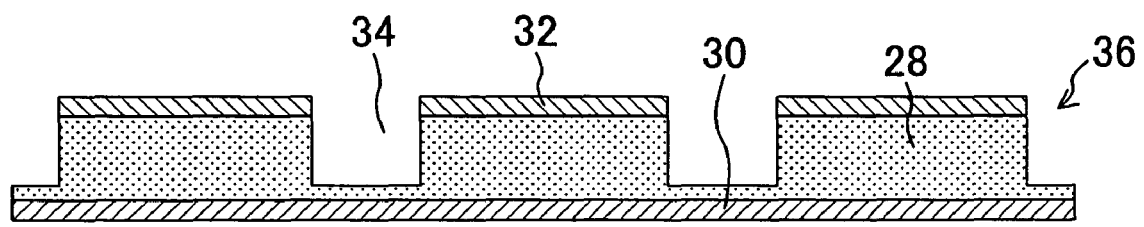

Subsequently, as shown in FIG. 2B, the defining grooves 34 are formed by wet etching the exposed part of the transparent plate 28. The wet etching can be easily performed when a chemical solution containing a hydrofluoric acid, for example, is used. The depth of the defining grooves 34 formed by this etching is set larger than the thickness of the transparent member 22 finally remaining on the face of the optical element 10 after polishing the transparent plate 28 of which step will be described later. For example, the depth of the defining grooves formed by etching in this step is set to approximately 380 μm when the thickness of the final transparent member 22 is 350 μm. Accordingly, it is necessary to set the thickness of the transparent plate 28 to be larger than the depth of the defining groove 34. The thickness of the transparent plate 28 is desirably set to approximately 500 μm when the depth of the defining grooves 34 is set to 380 μm. Following this etching, the photoresist pattern 32 is removed.

Figure 2C:
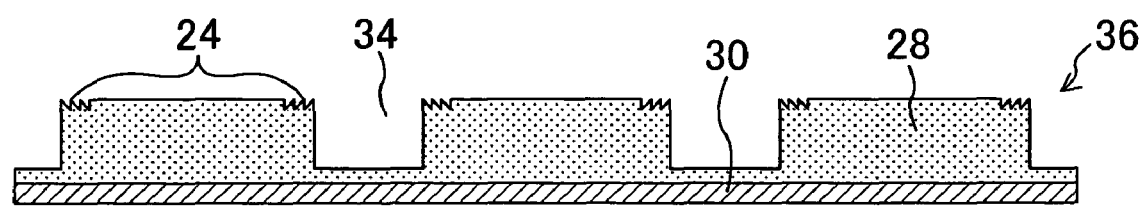

Next, as shown in FIG. 2C, a plurality of roughed regions 24 are formed using a dicing machine in parts of one face of the transparent plate 28, each of which corresponds to the peripheral circuit region 16 provided at the outer peripheral part of the light detecting region 14 (see FIG. 1A and FIG. 1B). The roughed regions 24 are easily formed by cutting the transparent plate 28 to the depth of approximately 100 μm by a dicing blade.

Figure 2D:
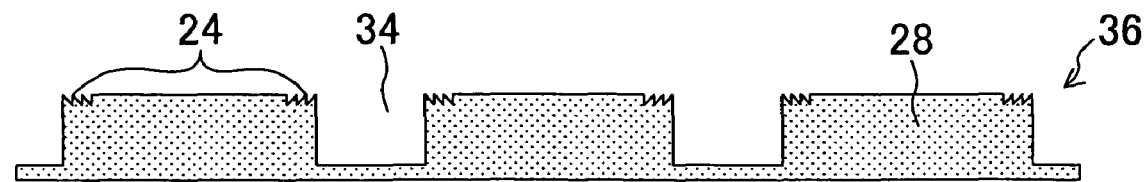

Following formation of the roughed regions 24, as shown in FIG. 2D, the surface protection film 30 is removed from the transparent plate 28 to obtain the transparent member array 36. It is noted that quartz, crystal, or the like other than the optical glass may be employed as a material of the transparent plate 28. Alternatively, a transparent resin material may be employed.

The defining grooves 34 may be formed by sandblasting, dry etching, or the like, rather than etching. The roughed regions 24 may be formed by dry or wet etching. Alternatively, the roughed regions 24 may be formed by sandblasting or laser beam machining. The roughed regions 24 may not be formed in a sharp saw-toothed shape in section and can exhibit a larger antireflection effect with the inner face thereof roughened.

The optical device manufacturing method using the thus formed transparent member array 36 will be described next. FIG. 3A to FIG. 3D, FIG. 4A, and FIG. 4B are sections showing a process of forming the transparent members 22 in batch on the optical element array 42 in the optical device manufacturing method of the present embodiment.

Figure 3A:
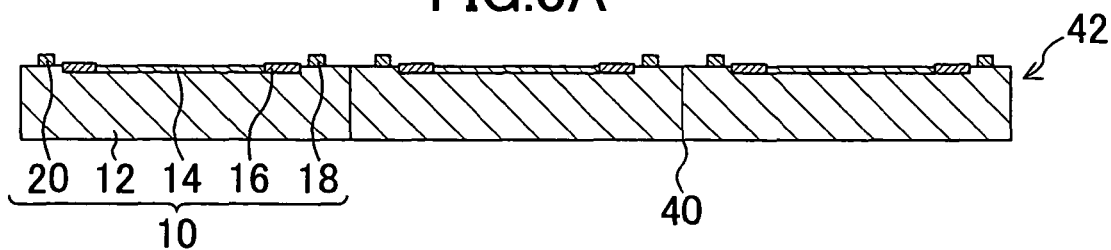
FIG. 3A to FIG. 3D are sections showing a process of forming transparent members in batch on an optical element array in the optical device manufacturing method according to Embodiment 1.

First, as shown in FIG. 3A, an optical element array 42 is prepared in which a plurality of optical elements 10 are formed at a predetermined arrangement pitch, wherein each optical element 10 includes the light detecting region 14, the peripheral circuit region 16, and the electrode region 18 which are formed on one of the principal faces of the semiconductor substrate 12. Dicing lines 40 are formed in the optical element array 42 for separating the optical elements 10 individually.

Figure 3B:
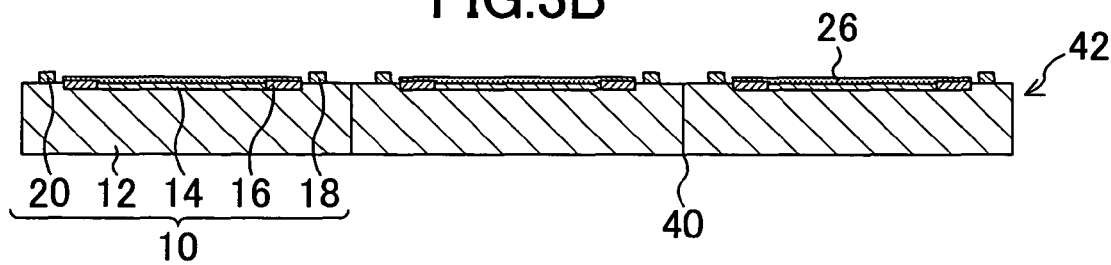

Subsequently, as shown in FIG. 3B, the transparent resin adhesive 26 is applied onto the light detecting regions 14 and the peripheral circuit regions 16 arranged in the outer peripheral parts thereof of the respective optical elements 10 or onto the entirety or part of each peripheral circuit regions 16. In order to ensure electrical connection with an external appliance, the transparent resin adhesive 26 must be applied so as not to reach the electrode regions 18. It is noted that the present step may be carried out by screen printing. Alternatively, for accurate application, it may be carried out by lift-off method in which a photoresist is formed by a photolithography process on a region where the transparent resin adhesive 26 is not to be applied, the transparent resin adhesive 26 is applied, and then, the photoresist is removed. Or, a photosensitive transparent resin adhesive may be used. Further, the transparent resin adhesive 26 may be applied only necessary part by rendering. Moreover, a semi-hardened pre-impregnated sheet made of a transparent resin adhesive may be processed to have the same shape as the region where the transparent resin adhesive is to be applied and, then, be attached to the optical element array 42.

Figure 3C:
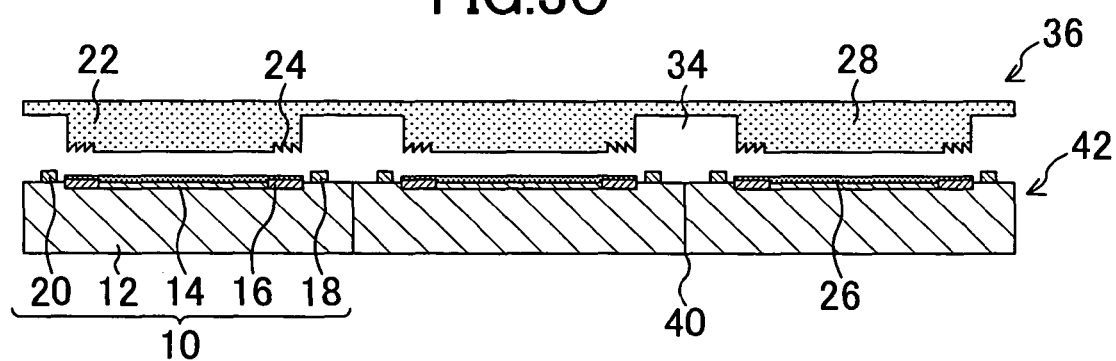

Next, as shown in FIG. 3C, the transparent member array 36 is aligned with the face where the roughed regions 24 thereof are formed allowed to face the circuit formation face of the optical element array 42 so that the roughed regions 24 are not overlapped with and surround the light detecting regions 14. By this alignment, the electrode terminals 20 provided in the electrode regions 18 are arranged within the defining grooves 34.

Figure 3D:
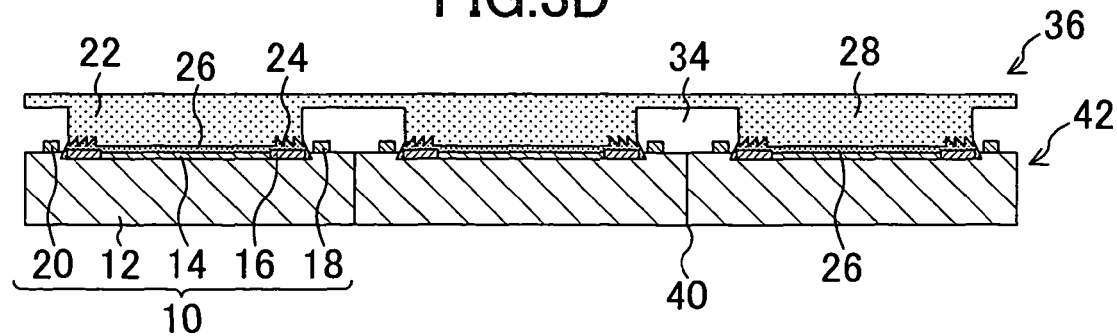

Thereafter, as shown in FIG. 3D, the transparent member array 36 and the optical element array 42 are made to adhere to each other with the transparent resin adhesive 26 interposed. The transparent resin adhesive 26 is hardened as it is. When an adhesive which is hardened by a ultraviolet ray is used as the transparent resin adhesive 26, the transparent resin adhesive 26 can be hardened by irradiating the ultraviolet ray over the transparent member array 36. Alternatively, when a thermosetting adhesive is used as the transparent resin adhesive 26, it is hardened by heating the entirety while keeping the adhesion state of the transparent member array 36 and the optical element array 42.

Figure 4A:
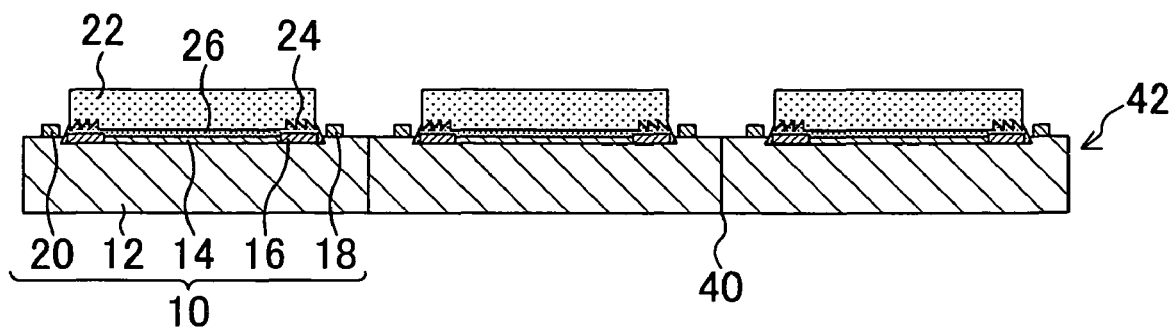
FIG. 4A and FIG. 4B are sections showing the process of forming the transparent members in batch on the optical element array in the optical device manufacturing method according to Embodiment 1.

Next, as shown in FIG. 4A, the transparent member array 36 is polished until polishing reaches the defining groves 34 of the transparent member array 36. When polishing progress up to the bottom of the defining grooves 34, the transparent member array 36 is divided into the individual transparent members 22. Though the transparent member array 36 is divided into the transparent members 22, the transparent members 22 are held by and remain to adhere to the optical element array 42. In this state, the surfaces of the transparent members 22 are subjected further to mirror polishing.

Figure 4B:
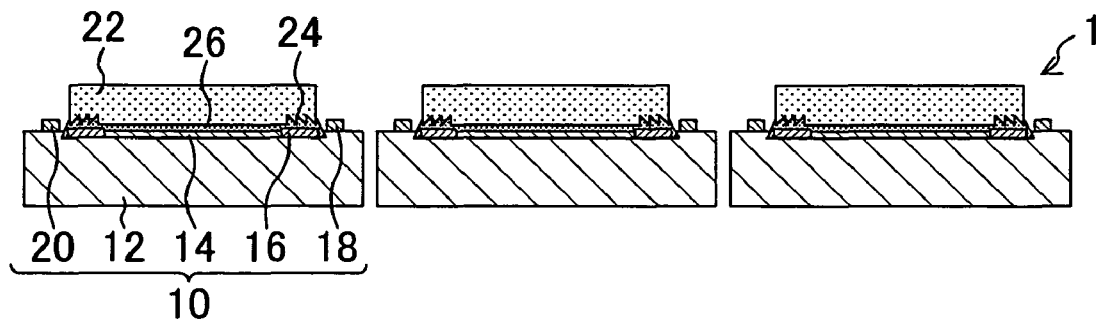

Subsequently, as shown in FIG. 4B, the optical element array 42 is cut along the dicing lines 40 to be divided into the individual optical elements 10, thereby obtaining the optical devices 1 of the present invention.

In the optical device 1 of the present embodiment, the transparent member 22 adheres and is fixed directly onto the light detecting region 14 by means of the transparent resin adhesive 26, and the roughed region 24 is formed in a region of the transparent member 22 at the outer peripheral part of the light detecting region 14. This suppresses entering of reflected light from an electrode terminal 20, a wire lead connected thereto, or the like into the light detecting region 14. Therefore, in a case of the optical device 1 including a light receiving element, a smear and a flare can be prevented. In a case of the optical device 1 including a light emitting element, the optical axis of emitting light can be corrected easily, compared with the case where the transparent member 22 is arranged apart from the light emitting element, because of direct adhesion of the transparent member 22 to the light emitting element, resulting in prevention of lowering of emitted light output.

Further, the transparent members 22 in the form of the transparent member array 36 are made to adhere and be fixed to the optical element array 42 and, then, are divided in batch, simplifying the manufacturing process.

Figure 5A:
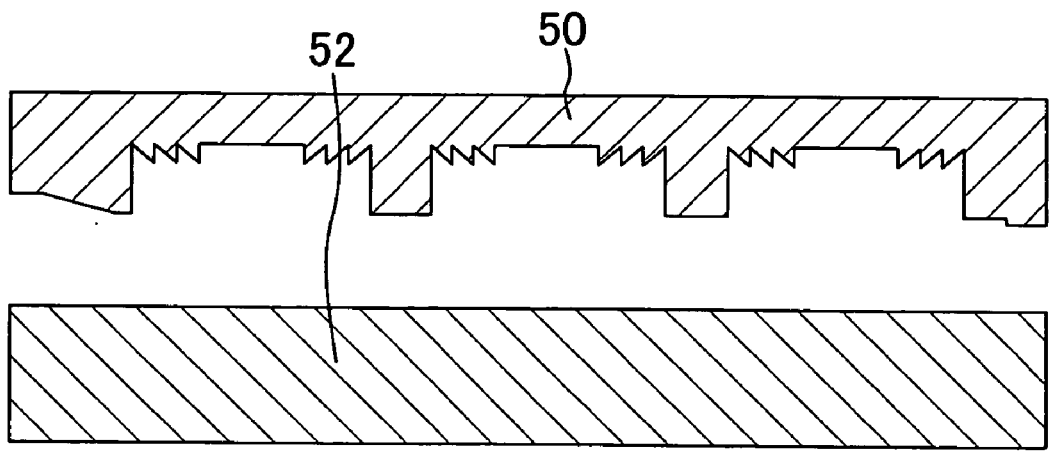
FIG. 5A to FIG. 5C are sections showing a process of forming a transparent array with the use of a resin molding die.
Figure 5B:
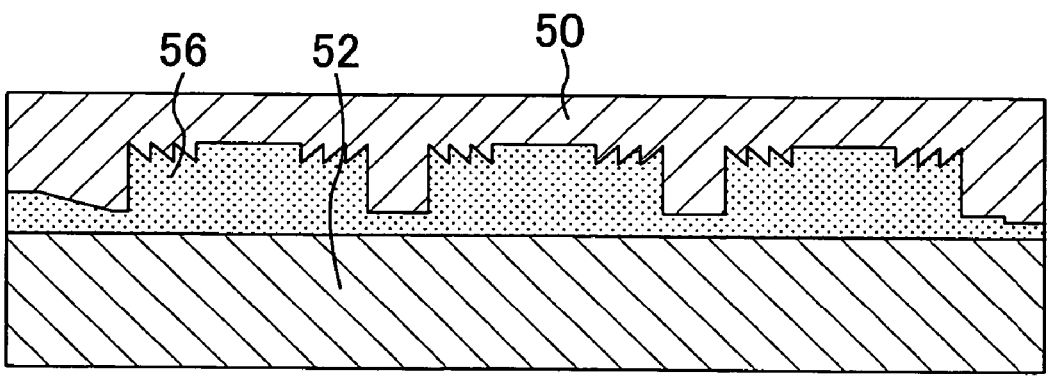
Figure 5C:
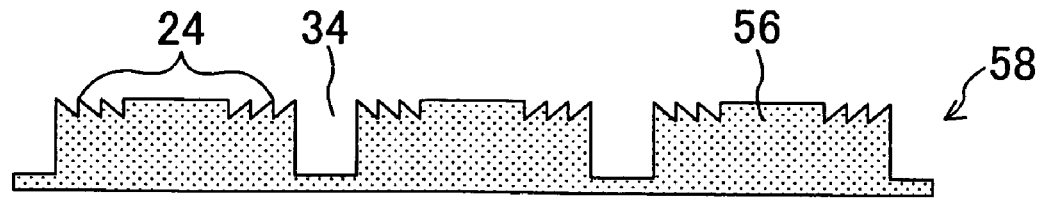

In the present embodiment, the transparent member array 36 is formed by etching, sandblasting, or the like, but the formation method of the transparent member array 36 in the present invention is not limited thereto. For example, in a case employing a resin material as a composition material of the transparent member 22, the transparent member array 36 may be formed by molding using a resin molding die, as shown in FIG. 5A to FIG. 5C. FIG. 5A to FIG. 5C are sections showing a process of forming a transparent member array 58 with the use of a resin molding die.

First as shown in FIG. 5A, an upper die 50 and a lower die 52 in which a resin injection port (gate portion) is formed are prepared. The upper die 50 and the lower die 52 form in combination a cavity having a pattern reverse to the aforementioned transparent members 22 correspondingly to the optical elements 10 of the optical element array 42 (see FIG. 3C, for example).

Next, as shown in FIG. 5B, a resin 56 having a viscosity lowered by heating is injected from the injection port and is filled in the cavity while reducing the pressure within a gap between the upper die 50 and the lower die 52 of the resin molding die. Then, the resin 56 is cooled to be hardened.

Subsequently, as shown in FIG. 5C, the resin 56 is taken out by separating the upper die 50 and the lower die 52. Then, the gate portion for injecting the resin 56 and an air vent section for pressure reduction are removed. Thus, the transparent member array 58 made of the resin 56 is obtained. The steps thereafter for manufacturing the optical device are the same as those in the above embodiment, and therefore, the description thereof is omitted.

The resin 56 employable in this formation method includes epoxy-based resin, acryl-based resin, and polyimide-based resin as typical examples, but another transparent resin material may be employed.

First Modified Example

Figure 6A:
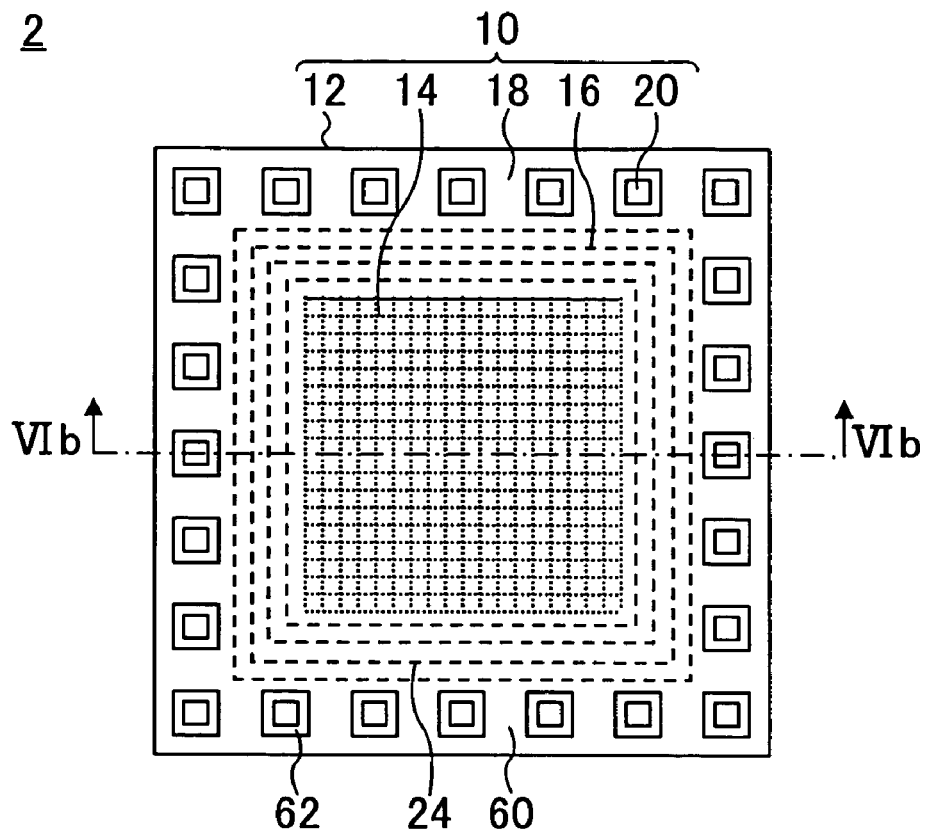
FIG. 6A is a plan view showing an optical device according to First Modified Example of Embodiment 1.
Figure 6B:
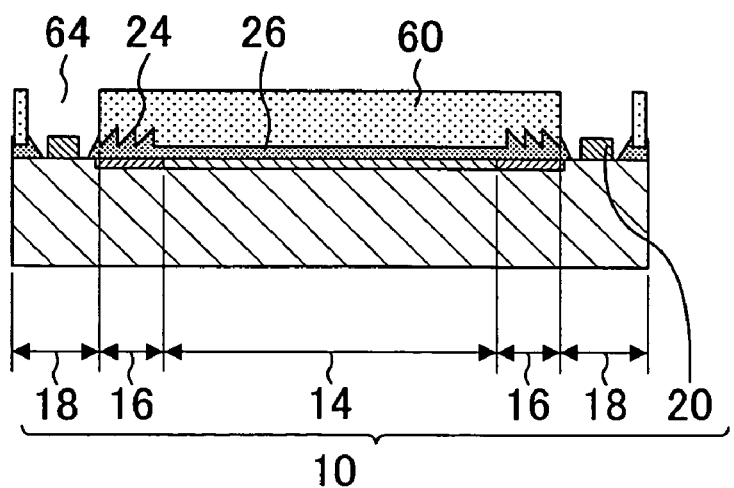
FIG. 6B is a section taking along the line VIb-VIb in FIG. 6A.

FIG. 6A is a plan view showing an optical device according to First Modified Example of the present embodiment, and FIG. 6B is a section taking along the line VIb-VIb in FIG. 6A.

As shown in FIG. 6A and FIG. 6B, an optical device 2 of First Modified Example is the same as the optical device 1 of Embodiment 1 except the point that a transparent member 60 different in shape from that in Embodiment 1 is formed on the optical element 10 used in Embodiment 1.

In the optical device 2 of the present modified example, the transparent member 60 is fixed on the optical element 10 by means of the transparent resin adhesive 26 so as to cover the entirety of the circuit formation face of the optical element 10. Wherein, opening parts 64 having a dimension in plan larger than the electrode terminals 20 of the optical element 10 are formed at parts overlapped with the electrode terminals 20. Accordingly, the dimension in plan of the transparent member 60 is the same as the dimension in plan of the optical element 10. The thickness of the transparent member 60 is set within the range between 200 μm and 500 μm, both inclusive and preferably is set to approximately 350 μm. In the transparent member 60, a roughed region 24 is formed in a region overlapped in plan with the outer peripheral part of the light detecting region 14 so that peaks and valleys are formed coaxially to form rectangles, similarly to the optical device 1 of Embodiment 1.

In the optical device 2 with the above structure, the transparent member 60 is attached substantially to the entirety of the optical element 10, increasing the mechanical strength. Also, the roughing region 24 is formed in the transparent member 60, so that entering of reflected light from an electrode terminal 20 or a wire lead into the light detecting region 14 is suppressed, similarly to the optical device 1 of Embodiment 1.

Difference of a manufacturing method of the optical device 2 of the present modified example from the manufacturing method of the optical device 1 of Embodiment 1 lies in that the transparent member array forming process is modified partially and that the transparent member array is cut together with the optical element array into individual pieces in the dicing step. The other steps are the same as those in the manufacturing method of the optical device 1 described in Embodiment 1. The partially modified process of forming the transparent member array will be described below.

In the optical device 2 of First Modified Example, the transparent member 60 is attached to almost all over the entirety of the circuit formation face of the optical element 10, and only the electrode terminals 20 and the outer peripheries thereof are exposed in the optical element 10. Accordingly, the photoresist pattern is formed to have openings larger than the electrode terminals 20 of the optical element 10 in the step shown in FIG. 2A. Following formation of such the photoresist pattern, the transparent plate is etched by the method described with reference to FIG. 2A to FIG. 2D. Thus, non-through holes are formed which have the same depth as the defining grooves 34 described with reference to FIG. 2A to FIG. 2D and which are larger than the electrode terminals 20. Following formation of the non-through holes, the transparent member array is formed by the same steps as those for manufacturing the optical device 1 of the present embodiment, and the optical element array is diced together with the transparent member array to be divided into individuals finally. Thus, the optical device 2 of First Modified Example is formed. It is noted that the transparent member array may be formed using a resin molding die also in First Modified Example.

In the optical device 2 of First Modified Example, the electrode terminals 20 are arranged at the bottoms of the opening parts 64 of the transparent member 60. This facilitates connection between the electrode terminals 20 and an external appliance by for example, only filling a conductive adhesive into the opening parts 64. Further, with the above structure, the mechanical strength increases, and the roughed region 24 suppresses entering of stray light into the light detecting region 14.

Second Modified Example

Figure 7A:
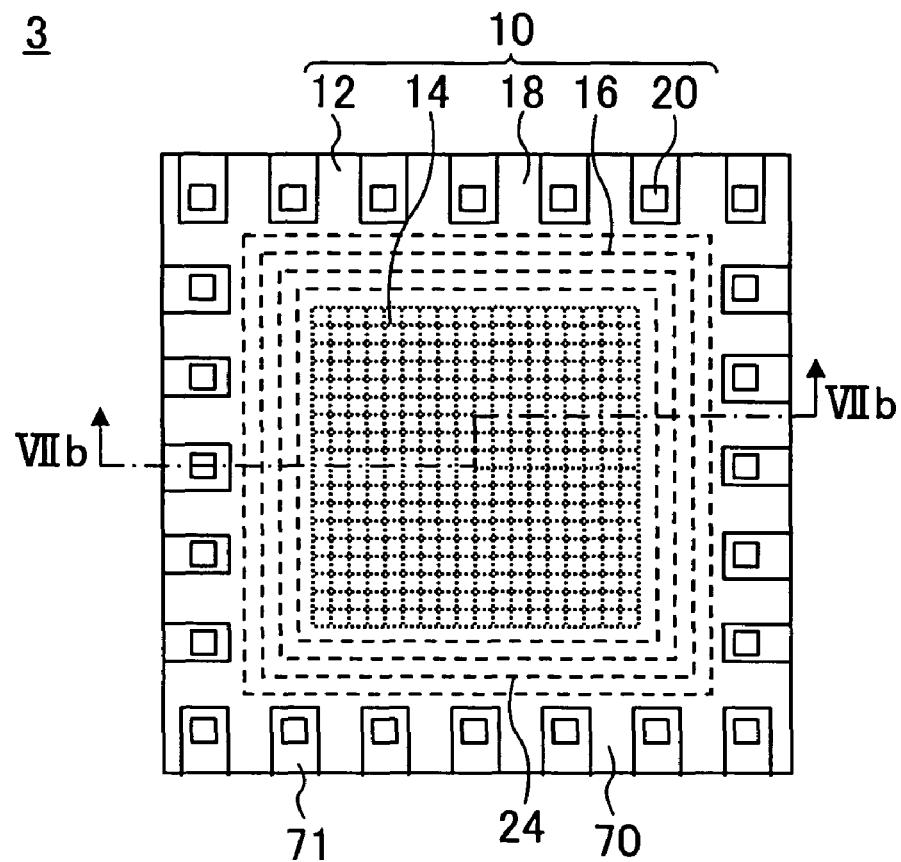
FIG. 7A is a plan view showing an optical device according to Second Modified Example of Embodiment 1.
Figure 7B:
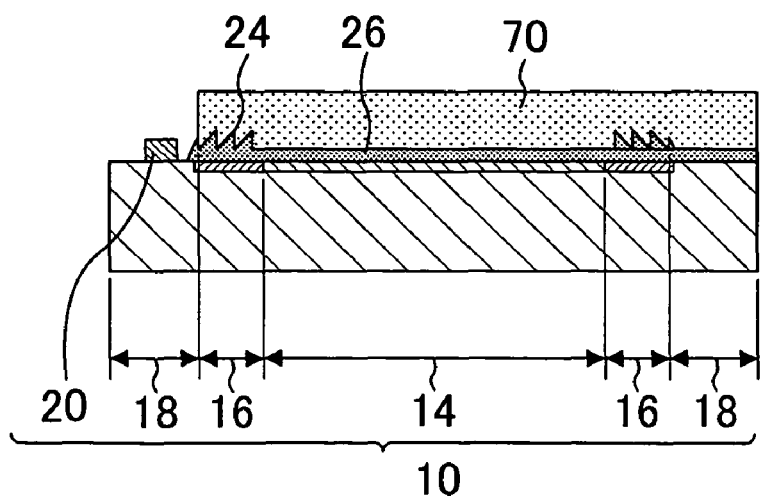
FIG. 7B is a section taking along the line VIIb-VIIb in FIG. 7A.

FIG. 7A is a plan view showing an optical device 3 according to Second Modified Example of the present embodiment, and FIG. 7B is a section taking along the line VIIb-VIIb in FIG. 7A.

The optical device 3 of the present modified example is an optical device 2 of First Modified Example of which part is further modified. In the optical device 2 of First Modified Example, the opening parts 64 of the transparent member 60 are slightly larger than the electrode terminals 20 of the optical element 10. In contrast, in the optical device 3 of Second Modified Example, as shown in FIG. 7A and FIG. B, opening parts 71 form squared C-shapes in plan by cutting parts including regions of the transparent member 70 which are overlapped with the electrode terminals 20. Accordingly, the outer shape of the transparent member 70 is a rectangle in plan with indentations. The elements other than the transparent member 70 and the manufacturing method thereof are the same as those of the optical device 2 of First Modified Example, and therefore, the description thereof is omitted.

As described above, the transparent member of the optical device of the present embodiment may have any shape only if the roughed region is not overlapped with the light detecting region 14 and the electrode terminals 20 are not covered. For example, the roughed region 24 may be formed on the electrode region 18 except the electrode terminals 20.

Embodiment 2

Figure 8:
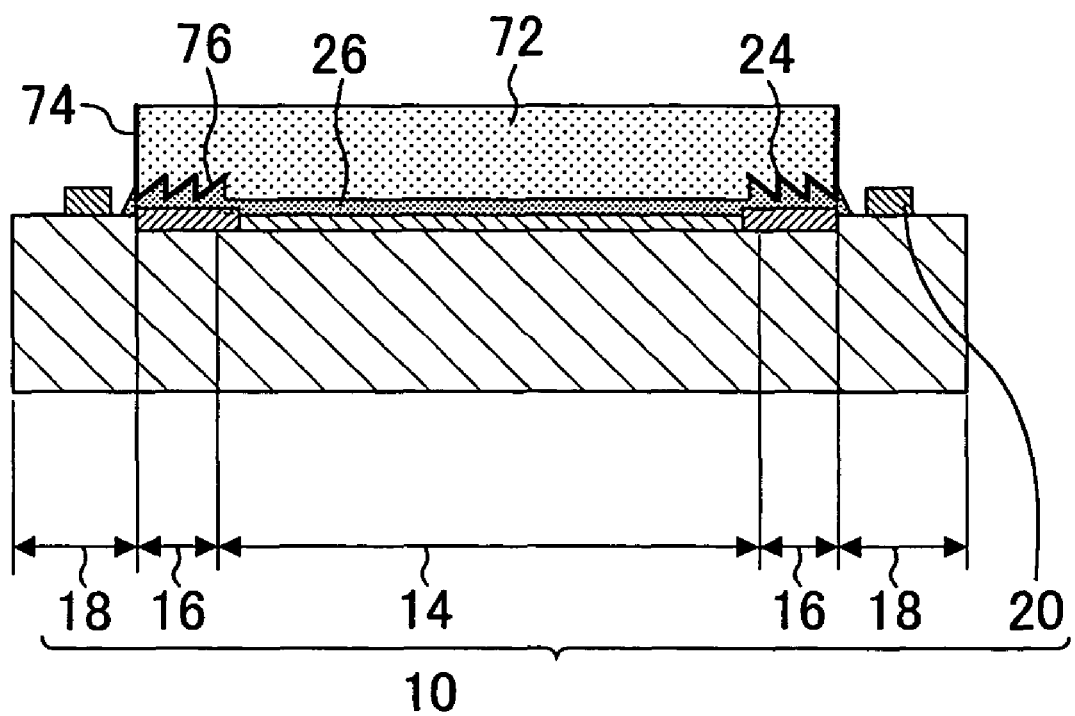
FIG. 8 is a section showing an optical device according to Embodiment 2 of the present invention.

FIG. 8 is a section showing an optical device 4 according to Embodiment 2.

As shown in FIG. 8, the optical device 4 of the present embodiment is different from the optical device 1 of Embodiment 1 in that an antireflection film 74 and an antireflection film 76 are formed on the outer peripheral face (side face) of a transparent member 72 and the inner face of the roughed region 24, respectively. The other constitution thereof is the same as that of the optical device 1 of Embodiment 1.

As described above, the antireflection films 74, 76 are provided respectively on the outer peripheral face of the transparent member 72 and the inner face of the roughed region 24, suppressing entering of reflection light from an electrode terminal 20, a wire lead, or the like into the light detecting region 14 further reliably.

Figure 9:
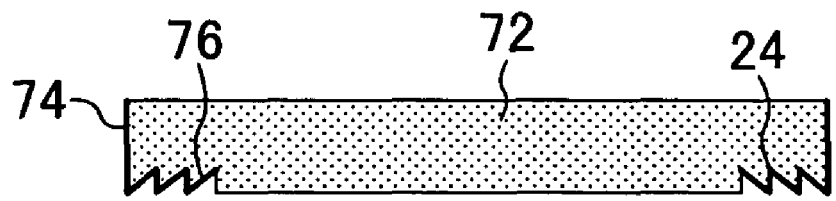
FIG. 9 is a section showing a transparent member used in the optical device according to Embodiment 2.

A method for manufacturing the optical device 4 of the present embodiment will be described below with reference to FIG. 9 and FIG. 10A to FIG. 10E. FIG. 9 is a section of the transparent member 72 used in the optical device 4 of the present embodiment. In the optical device 4 of the present embodiment, the individual transparent members 72 are made to adhere and fixed one by one rather than in the form of an array onto regions where light is to be detected on the circuit formation face of the optical element array.

The transparent member 72 shown in FIG. 9 is formed as follows.

First, transparent plates are prepared which have a dimension in plan smaller than the electrode region 18 and larger than the light detecting region 14 of the optical element 10. Not only an inorganic material such as glass, quartz, crystal or the like, any transparent resin material may be employed as a material of the transparent plate, as described in Embodiment 1.

Next, in each transparent plate, the roughed region 24 is formed so as to be large enough to surround the light detecting region 14 and so as to be in a form of a rectangle like one formed of four strips. The roughed region 24 can be easily formed by dicing as described in Embodiment 1 but may be formed by a photolithography process and etching. It is possible that the roughed region 24 is formed in a large transparent plate in advance, and then, the large transparent plate is cut into pieces of the transparent members 72.

Subsequently, the antireflection films 74, 76 are formed on the outer peripheral face of each transparent member 72 and the inner face of each roughed region 24, respectively. The antireflection films 74, 76 can be easily formed by, for example, depositing carbon with part corresponding to the light detecting region 14 masked. Alternatively, it may be formed by applying a black resin by rendering or ink jetting. Any material may be employed as a material of the antireflection films 74, 76 only if it has a low reflectance.

After the transparent members 72 are formed by the above described steps, the transparent members 72 are attached and fixed onto the circuit formation faces of the optical elements 10 including the light detecting regions 14, as in the step shown in FIG. 10A to FIG. 10E. FIG. 10A to FIG. 10E are sections showing a process of attaching and fixing the transparent member 72 onto the optical element 10 in the method for manufacturing the optical device 4 according to the present embodiment.

Figure 10A:
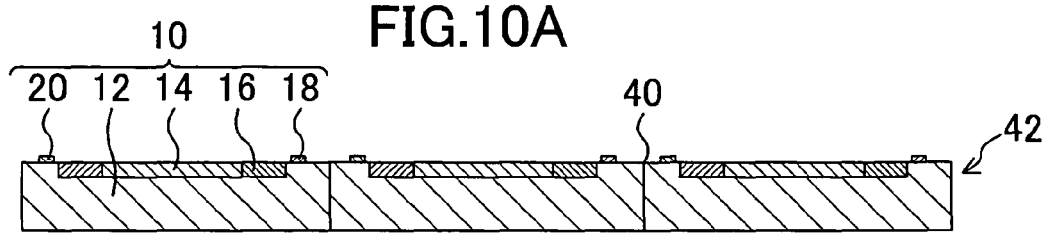
FIG. 10A to FIG. 10E are sections showing a process of making transparent members to adhere and be fixed onto optical elements in an optical device manufacturing method according to Embodiment 2.

First, as shown in FIG. 10A, the optical element array 42 described in Embodiment 1 is prepared.

Figure 10B:
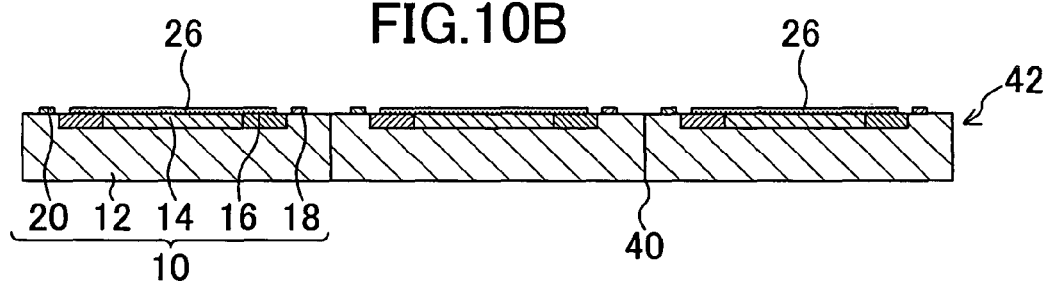

Next, as shown in FIG. 10B, the transparent resin adhesive 26 is applied onto regions including the light detecting regions 14 and the peripheral circuit regions 16 in the circuit formation faces of the optical elements 10. The steps so far are the same as those in Embodiment 1.

Figure 10C:
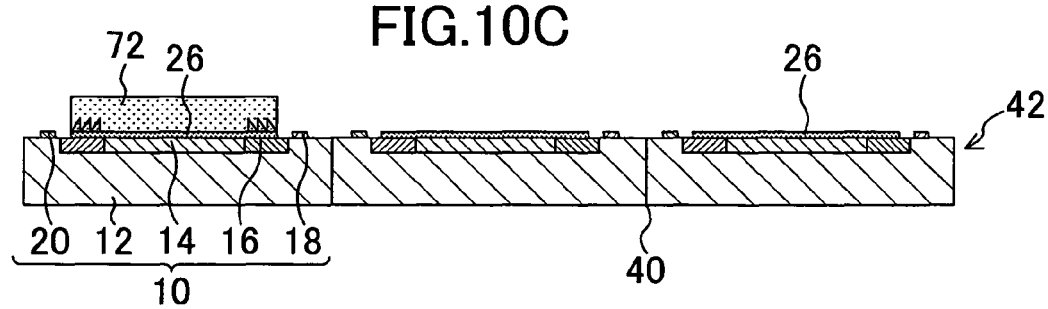

Subsequently, as shown in FIG. 10C, one transparent member 72 is aligned with respect to the light detecting region 14 of one of the optical elements 10 in the optical element array 42, and then, the transparent member 72 is attached and fixed onto the optical element 10 by means of the transparent resin adhesive 26. If the transparent resin adhesive 26 is one to be hardened by a ultraviolet ray, the ultraviolet ray is irradiated only to a region of the optical element array 42 where the transparent member 72 is attached so that the transparent resin adhesive 26 is hardened.

Figure 10D:
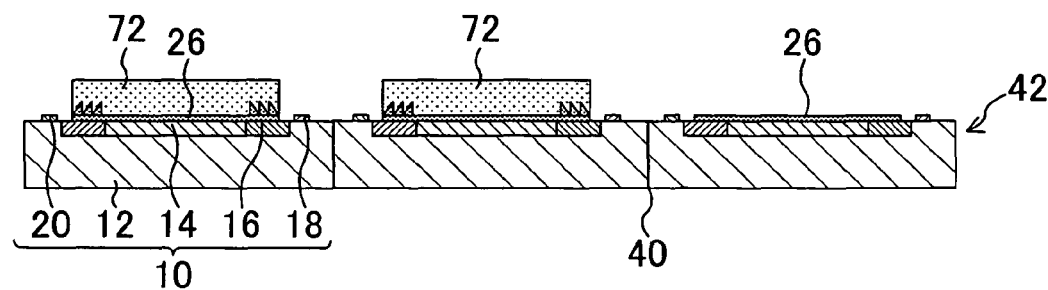
Figure 10E:
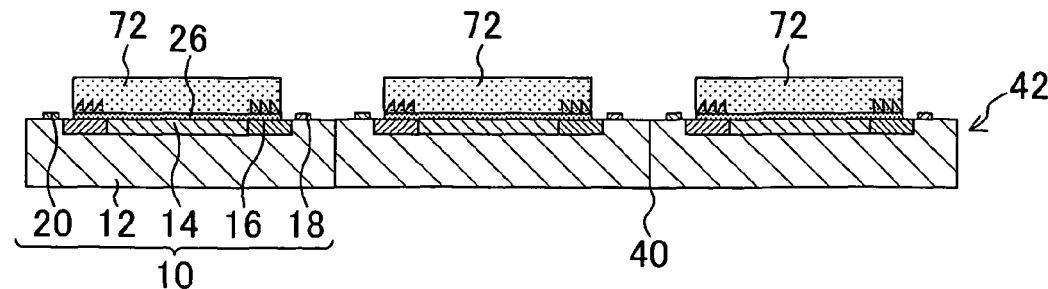

Thereafter, as shown in FIG. 10D and FIG. 10E, the transparent members 72 are attached and fixed to the circuit formation faces of the optical elements 10 one by one sequentially. In this way, the transparent members 72 are attached and fixed onto the circuit formation faces of all the optical elements 10 of the optical element array 42. Then, similarly to Embodiment 1, the optical element array 42 is diced along the dicing lines 40 to thus obtain the optical devices 4 of the present embodiment, which is shown in FIG. 8.

The optical device 4 of the present embodiment is manufactured by attaching the transparent member 72 in the form of an individual piece to the optical element 10. This makes the manufacturing method complicated to some extent but eliminates the need for the polishing process and the like after attachment. In addition, the antireflection films 74, 76 are formed on the outer peripheral face of the transparent member 72 and the inner face of the roughed region 24, respectively. Accordingly, even when a metal wire or an aluminum wire having a large reflectance is employed as a material of the wire leads, a smear and a flare, which would be caused due to reflected light from such a wire lead, are suppressed reliably.

In Embodiment 2, the reflection films 74, 76 may be formed on only one of the outer peripheral face of a transparent member 72 and the inner face of the roughed region 24.

Modified Example of Embodiment 2

Figure 11A:
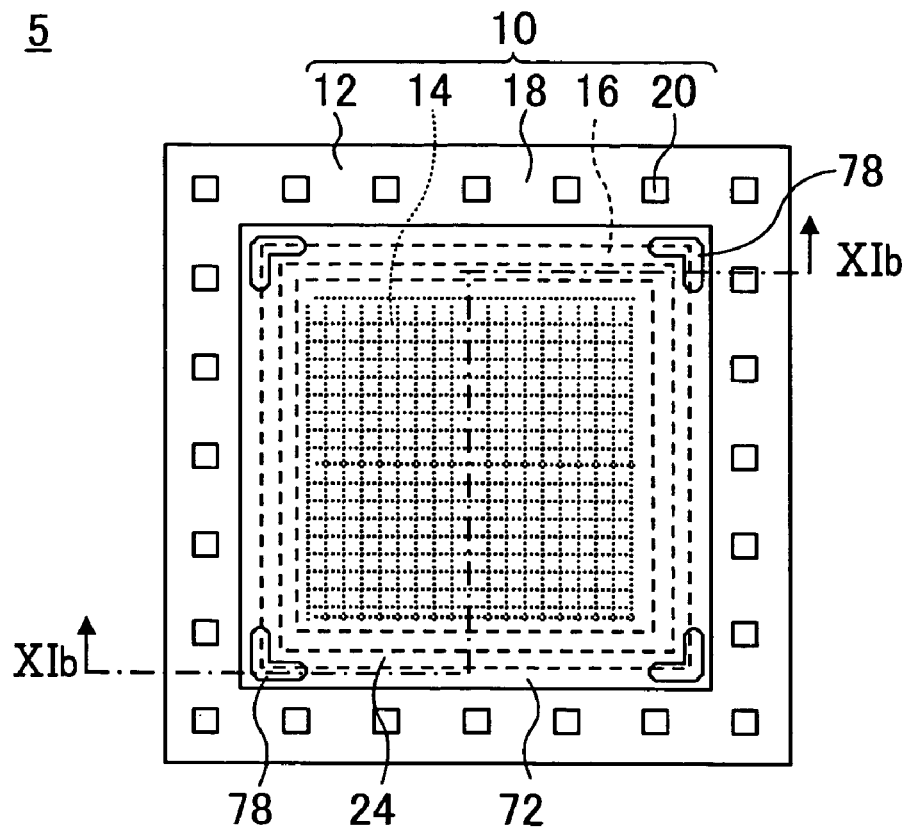
FIG. 11A is a plan view showing an optical device according to a modified example of Embodiment 2.
Figure 11B:
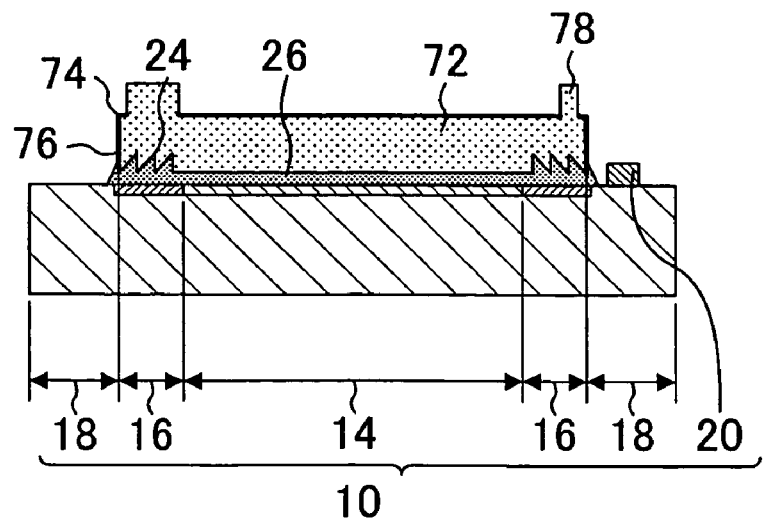
FIG. 11B is a section taking along the line XIb-XIb in FIG. 11A.

FIG. 11A is a plan view showing an optical device 5 according to a modified example of Embodiment 2, and FIG. 11B is a section taking along the line XIb-XIb in FIG. 11A.

As shown in FIG. 11A and FIG. 11B, the optical device 5 of the present modified example is different from the optical device 4 of Embodiment 2 in that projections 78 are formed at four corners of the face of the transparent member 72 which is the opposite face of the face where the roughed region 24 is formed. The other constitution thereof is the same as that of the optical device 4 of Embodiment 2, and therefore, the description thereof is omitted.

The projections 78 may be formed as a part of the transparent member 72 or may be formed by attaching another member to the transparent member 72 after the transparent member 72 is formed.

A material of the projections 78 may be the same as the material of the transparent member 72, for example, or may be a different material. The projections 78 are not necessarily transparent and may be formed by attaching or applying a metal foil or a resin.

Provision of the projections 78 facilitates accurate alignment of the optical device 5 at implementation thereof to a circuit board or the like of an electronic appliance and enables to accurately keep a distance between a circuit substrate and the transparent member. At least two projections 78 should be provided in a region not overlapped with the light detecting region 14 in plan.

In Embodiment 1 and Embodiment 2, the electrode region 18 and the peripheral circuit region 16 are defined explicitly separately. However, part of the peripheral circuit region 16 may be formed in the electrode region 18. In this case, the region where the electrode terminals are formed is deemed as the electrode region 18.

Further, in each of the optical devices of Embodiment 1 and Embodiment 2, the transparent member is attached to the optical element by applying the transparent resin adhesive to the peripheral circuit region 16 and the light detecting region 14 or only the peripheral circuit region 16. However, the present invention is not limited thereto. For example, an adhesive sheet such as a double-faced adhesive tape is attached to the peripheral circuit region or the peripheral circuit region and the electrode region except the electrode terminals, and then, the transparent member is attached thereto by means of the adhesive sheet. This forms a space with no adhesive in the light detecting region, eliminating the need to set a particular limitation of the reflectance of the transparent resin adhesive.

Embodiment 3

An optical device apparatus using the optical device according to Embodiment 1, Embodiment 2, or Modified Examples thereof will be described as Embodiment 3 of the present invention.

Figure 12:
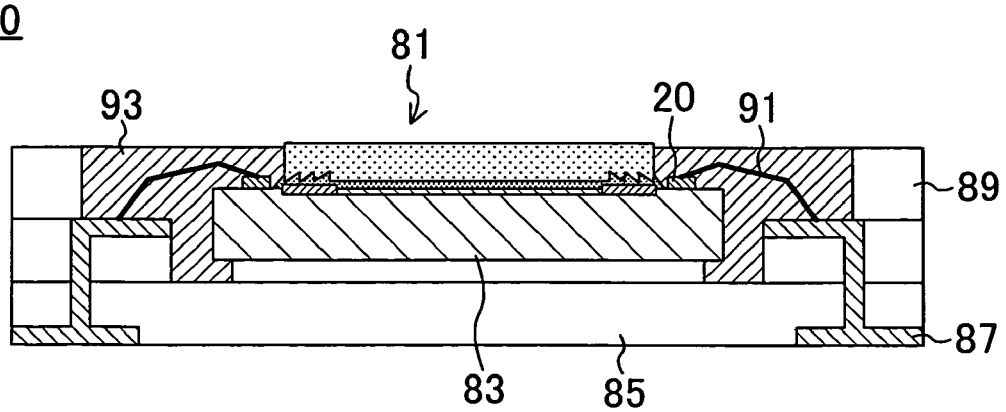
FIG. 12 is a section showing an optical device apparatus according to Embodiment 3.

FIG. 12 is a section showing the optical device apparatus 100 according to Embodiment 3.

As shown in FIG. 12, the optical device apparatus 100 of the present embodiment includes a substrate 85, an optical device 81 boarded on the substrate 85 by means of an adhesive 83 and including the electrode terminals 20 described in Embodiment 1 or 2, a frame body 89 provided on the substrate 85 for surrounding the optical device 81, an external terminal 87 exposed at the outer face (bottom face herein) of the optical device apparatus 100 and connected to the electrode terminals 20 by means of, for example, a metal wires 91, and a sealing resin 93 filled in the frame body 89 for sealing part of the optical device 81 and the metal wires 91.

Referring to the optical device 81, the transparent member is directly arranged on the face of the optical element, so that the optical device 81 has a thickness thinner than in the case where the transparent member and the optical element are arranged with a space left from each other. Further, with the roughed region, a smear and a flare are suppressed effectively. Hence, the optical device apparatus 100 including the optical device 81 becomes thin and, therefore, can be used favorably in a camera module or the like.

Embodiment 4

A camera module including the optical device apparatus according to Embodiment 3 will be described as Embodiment 4 of the present invention.

Figure 13:
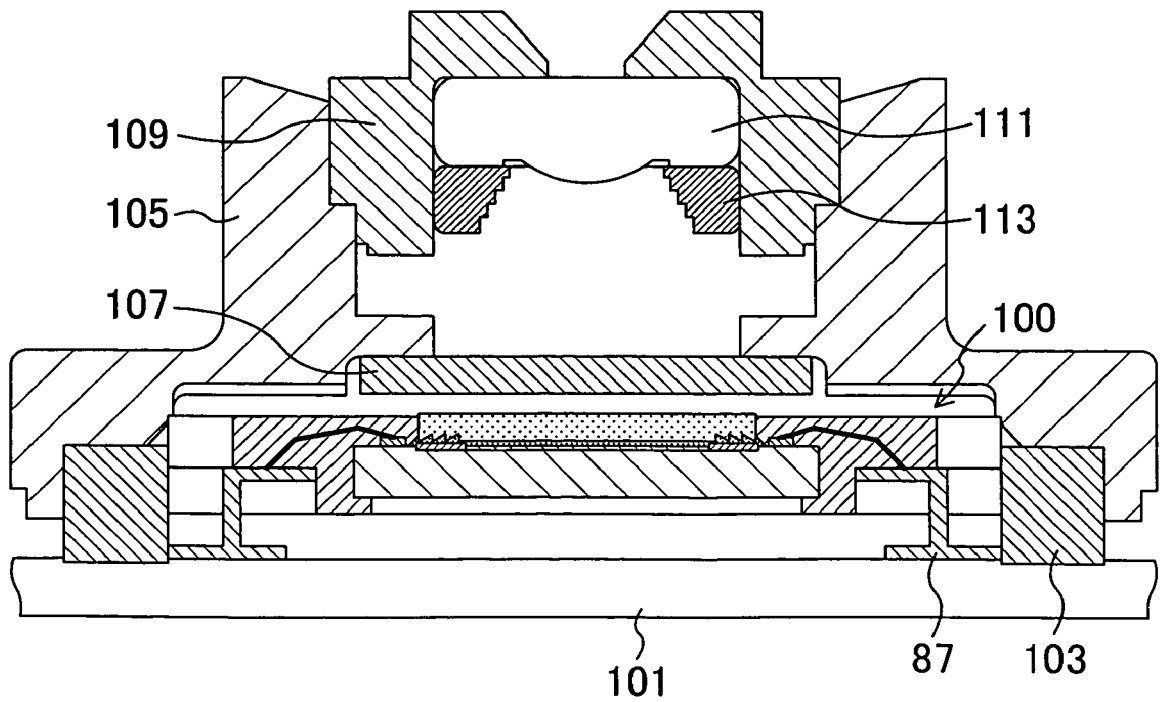
FIG. 13 is a section showing a camera module according to Embodiment 4.

FIG. 13 is a section showing a camera module according to Embodiment 4. The camera module herein may be any of various apparatuses such as a digital camera, a monitoring camera, a video camera, a camera for a mobile phone, and the like. In any camera module, the optical element of the optical device serves as a light receiving element such as an image sensor.

The camera module of the present embodiment includes a wiring substrate 101, the optical device apparatus 100 boarded on the wiring substrate 101, a positioning spacer 103 arranged around the optical device apparatus 100 on the wiring substrate 101, a body tube base 105 fixed above the wiring substrate 101 with the positioning spacer 103 interposed and forming a tubular opening part above the light detecting region (see FIG. 1 and the like), a glass plate 107 arranged above the light detecting region and fixed at the bottom of the opening part of the body tube base 105, a lens accommodating section 109 provided within the opening part of the body tube base 105, a lens holder 113 fixed in the lens accommodating section 109, and a lens 111 supported by the lens holder 113 and arranged above the light detecting region. The wiring provided in the wiring substrate 101 is connected to an external terminal 87 of the optical device apparatus 100.

With the thinned optical device apparatus 100, the camera module of the present embodiment is also thinned. The transparent member is arranged directly on the face of the optical element, reducing deviation of the optical axis to enable clear image shooting. In addition, the roughed region of the optical device suppresses a smear and a flare, resulting in an image obtained with fewer smears and fewer flare.

Hence, the optical device of the present invention is useful for various electronic appliances which need a shooting device, such as mobile phones, digital cameras, and the like.

What is claimed is:

1. A method for manufacturing an optical device comprising:
    a step (a) of forming an optical element array including a plurality of optical elements each including a region for light detection or emission and an electrode region in which an electrode terminal for connecting with an external circuit is formed;
    a step (b) of forming on the optical elements transparent members in which roughed regions are formed and each of which has a dimension in plan larger than the region for light detection or emission; and
    a step (c) of forming optical devices each including the optical element and the transparent member by dicing the optical element array,
    wherein in the step (b), each of the transparent members are formed so that the roughed region faces a region surrounding the region for light detection or emission,
    wherein each of the transparent members formed in the step (b) covers a region for light detection or emission and the electrode region except the electrode terminal,
    the step (b) includes:
    a step (b8) of forming non-through holes in parts of a transparent plate which corresponds to the electrode terminals;
    a step (b9) of forming a transparent member array by forming the roughed regions in regions where the non-through holes are formed in a face of the transparent plate where the non-through holes are formed;
    a step (b10) of making, after the step (b9), the transparent member array to adhere onto the optical member array so that the non-through holes are located above the electrode terminals with the face where the non-through holes are formed facing the optical elements; and
    a step (b11) of polishing the transparent member array up to the non-through holes, wherein in the step (c), the transparent member array is diced together with the optical element array, and
    wherein the depth of the non-through hole formed in the step (b8) is equal to or larger than the thickness of the transparent member formed in the step (b11).

* * * * *